(12) United States Patent
Kong

(10) Patent No.: US 8,235,095 B2
(45) Date of Patent: Aug. 7, 2012

(54) HEAT DISSIPATION DEVICE

(75) Inventor: Cheng Kong, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 639 days.

(21) Appl. No.: 12/409,516

(22) Filed: Mar. 24, 2009

(65) Prior Publication Data

US 2010/0155022 A1 Jun. 24, 2010

(30) Foreign Application Priority Data

Dec. 22, 2008 (CN) .......................... 2008 1 0306415

(51) Int. Cl.
- *F28F 7/00* (2006.01)
- *H01L 23/467* (2006.01)
- *H05K 7/20* (2006.01)
- *F01D 5/08* (2006.01)
- *F01D 25/26* (2006.01)

(52) U.S. Cl. ....... 165/80.3; 165/121; 361/697; 361/704; 415/176; 415/177; 415/213.1

(58) Field of Classification Search .................. 165/185, 165/80.3; 361/704, 710, 679.47; 415/175–178, 415/213.1, 214.1
See application file for complete search history.

(56) References Cited

U.S. PATENT DOCUMENTS

| 5,615,084 A * | 3/1997 | Anderson et al. ............. 361/697 |
| 7,207,758 B2 * | 4/2007 | Leon et al. ..................... 411/45 |
| 2004/0000398 A1 * | 1/2004 | Lee et al. ...................... 165/185 |

* cited by examiner

*Primary Examiner* — Allen Flanigan
*Assistant Examiner* — Jason Thompson
(74) *Attorney, Agent, or Firm* — Altis Law Group, Inc.

(57) ABSTRACT

A heat dissipation device includes a heat sink, a fan mounted on a side of the heat sink, and an engaging portion pivotally engaging with the heat sink and connecting the fan and the heat sink. The fan includes a bracket. A mounting plate with a mounting hole is formed by the bracket. The engaging portion includes a pivot portion pivotally engaging with the heat sink and a pressing portion extending from the pivot portion. A protruded portion extends downwardly from a bottom surface of the pressing portion. The pressing portion presses the mounting portion of the bracket of the fan and the protruded portion engages in the mounting hole of the mounting portion.

11 Claims, 5 Drawing Sheets

HEAT DISSIPATION DEVICE

BACKGROUND OF THE INVENTION

1. Field of the Invention

The present invention relates to heat dissipation devices, and particularly, to a fan capable of being conveniently assembled to and disassembled from a heat sink, and a heat dissipation device having such a fan and a heat sink.

2. Description of Related Art

A heat sink is usually placed in thermal contact with a heat generating electronic device such as a central processing unit (CPU), and transfers heat through conduction away from the heat generating electronic device so as to prevent over-heating of the heat generating electronic device.

Conventionally, a fan is used to mount on a side of the heat sink to improve heat dissipation efficient of the heat sink. The fan and the heat sink are assembled together by a plurality of screws. The screws may be assembled to and disassembled from the heat sink one by one. This is very time-consuming and trouble.

What is needed, therefore, is a fan capable of being conveniently assembled to and disassembled from a heat sink, and a heat dissipation device including such a heat sink and a fan, thereby overcoming the above-described problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
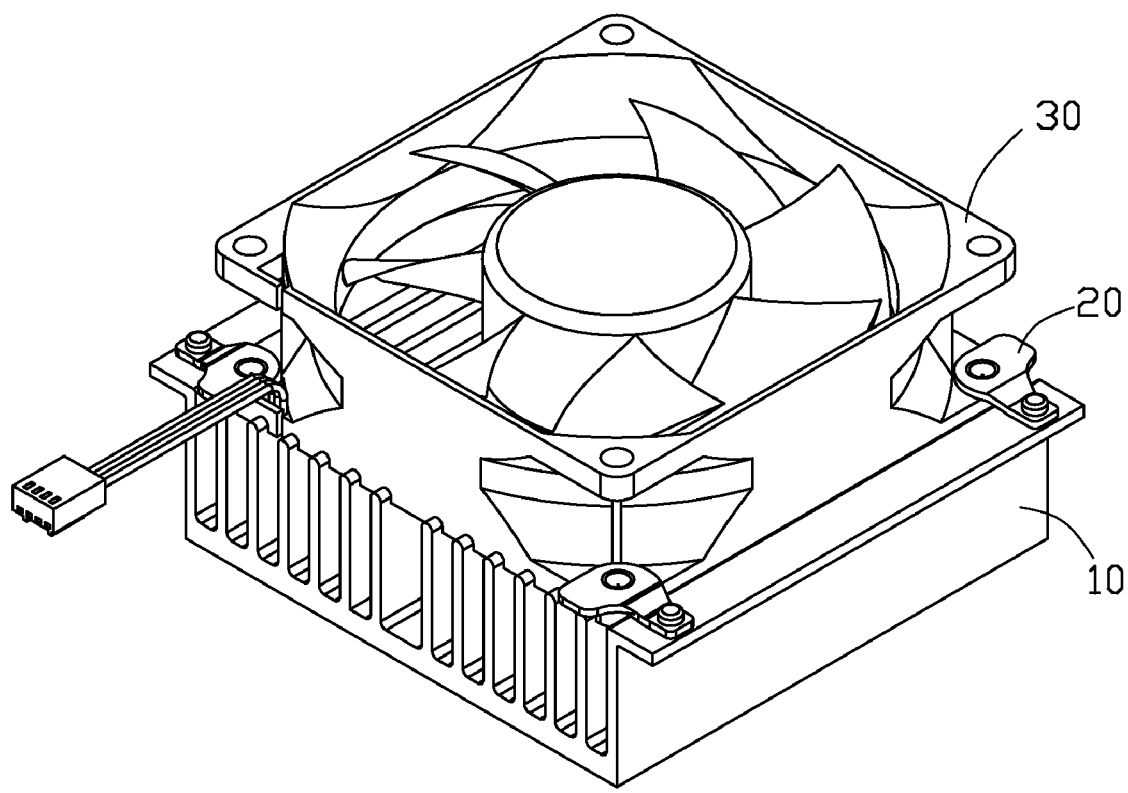
FIG. 1 is an assembled view of a heat dissipation device in accordance with an embodiment of the invention.

Referring to FIG. 1, an embodiment of a heat dissipation device comprises a heat sink 10, a fan 30 mounted on a top side of the heat sink 10 and a plurality of connecting members 20 pivotally engaging with the heat sink 10 to secure the fan 30 to the heat sink 10.

Figure 2:
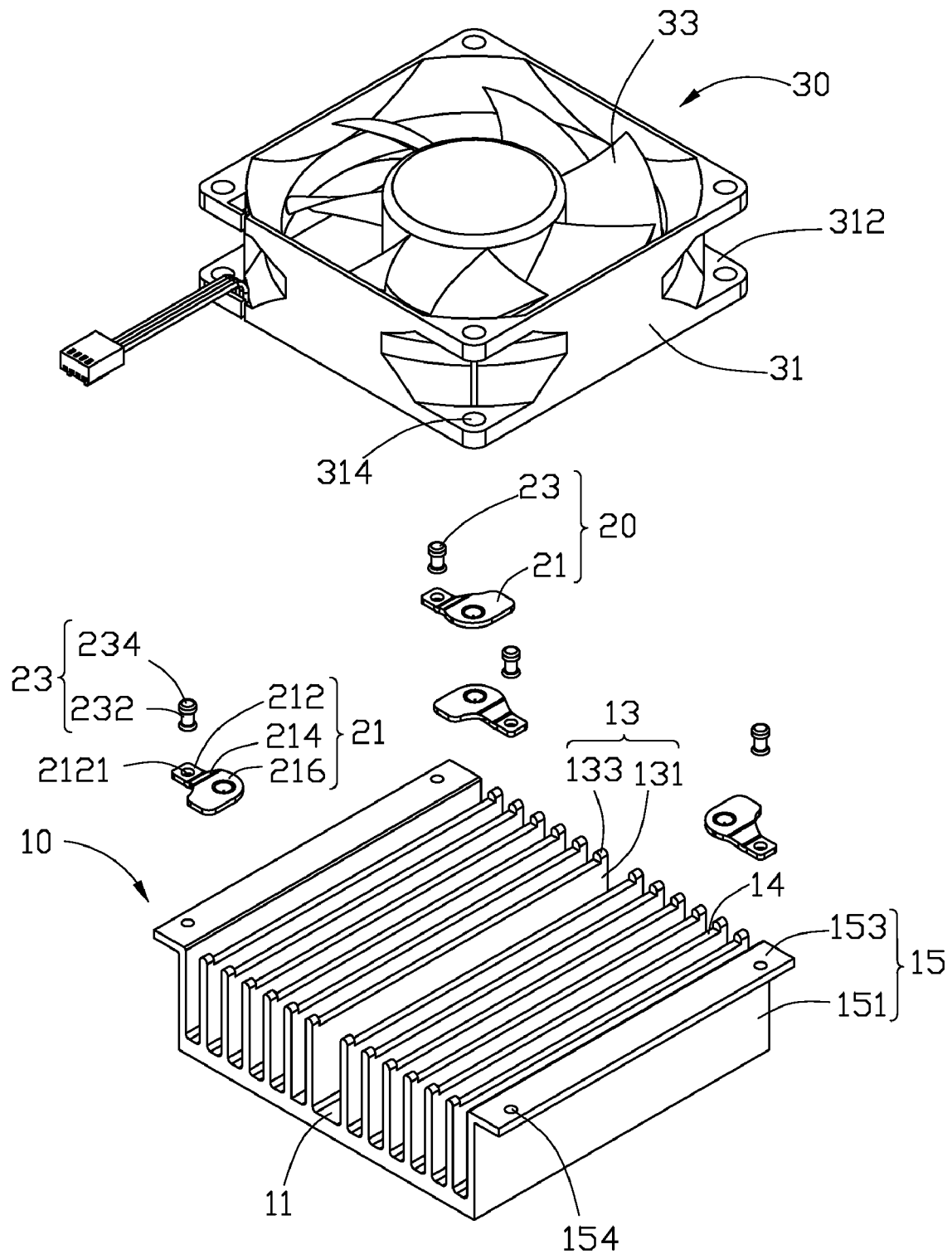
FIG. 2 is an exploded view of the heat dissipation device in FIG. 1.
Figure 3:
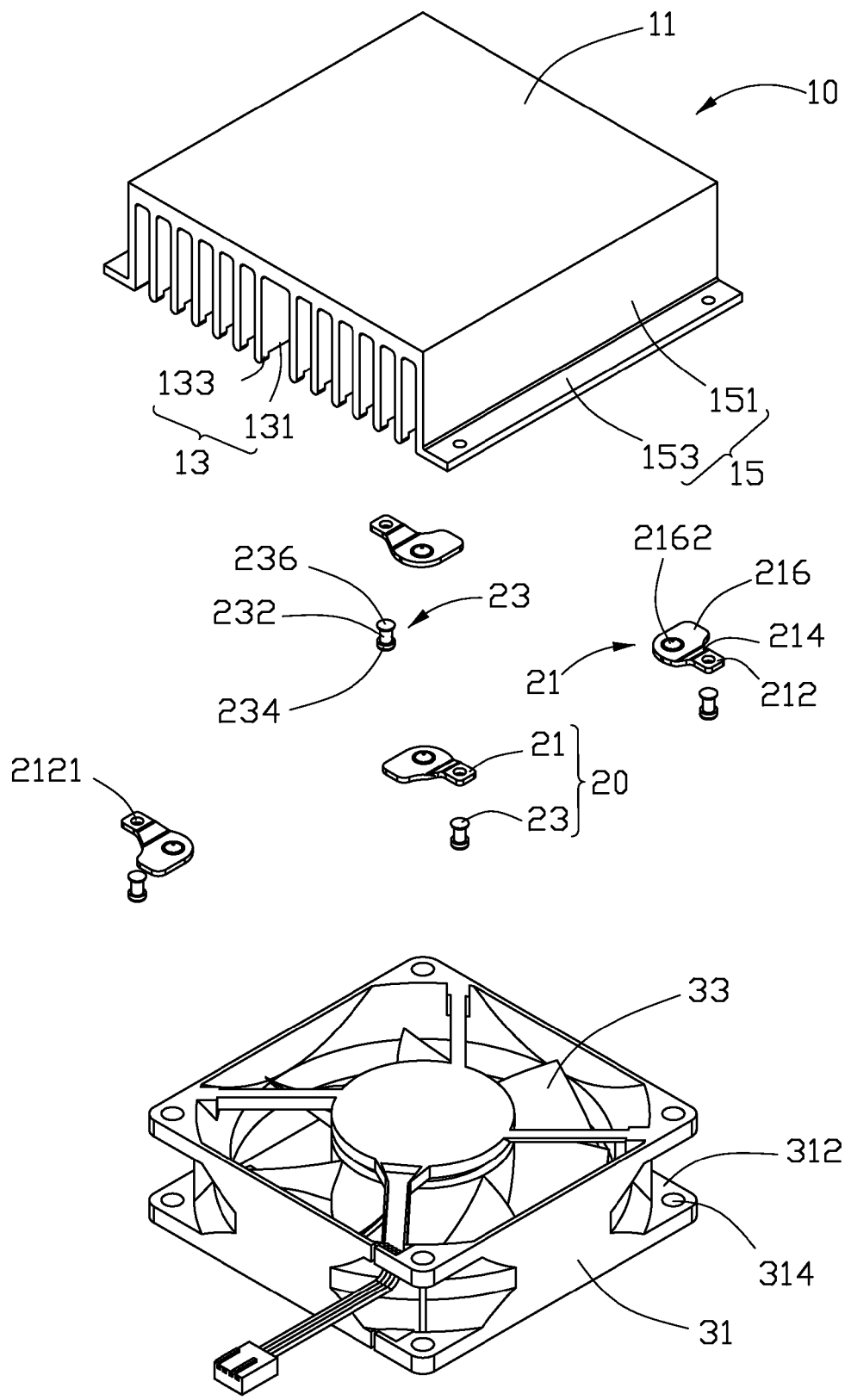
FIG. 3 is an inverted view of the heat dissipation device in FIG. 2.

Referring to FIGS. 2-3, the heat sink 10 comprises an elongated base 11, a plurality of first fins 13 extending upwardly from a central portion of the base 11, and two second fins 15 extending upwardly from opposite edges of the base 11. Length of each of the first fins 13 and the second fins 15 equals to that of the base 11. The first fins 13 are positioned between the two second fins 15. Each of the first fins 13 comprises an elongated first body 131 perpendicularly connecting with the base 11 and two baffling portions 133 extending upwardly from opposite ends of the first body 131. Each of the second fins 15 comprises an elongated second body 151 perpendicularly connecting with the base 11 and an elongated extending portion 153 perpendicularly extending outwardly from a top end of the second body 151. The two extending portions 153 of the two second fins 15 are respectively located at outer sides of the second bodies 151 of the two second fins 15. The first bodies 131 of the first fins 13 and the second bodies 151 of the second fins 15 are parallel to and spaced from each other. Top surfaces of the two extending portions 153 and tops of the baffling portions 133 are coplanar. A recess 14 is enclosed by the second bodies 151 and the baffling portions 133 to receive the fan 30 therein. The fan 30 is received in the recess 14 and supported by tops of the first bodies 131. A periphery of the fan 30 abuts against inner surfaces of the baffling portions 133 and inner surfaces of the second bodies 151.

Each of the connecting members 20 comprises an engaging portion 21 and a connecting portion 23. In this embodiment, the engaging portion 21 is a resilient metal sheet, and the connecting portion 23 is a rivet. The engaging portion 21 has an L-shaped configuration and comprises a pivot portion 212, a transition portion 214 slantwise and upwardly extending from an edge of the pivot portion 212, and a pressing portion 216 horizontally extending from the transition portion 214. The pressing portion 216 and the pivot portion 212 are spaced from and parallel to each other. The pressing portion 216 has a size larger than the pivot portion 212. The transition portion 214 has a trapeziform shape and includes a short end and a long end parallel with each other. A width of the transition portion 214 gradually increases from the short end to the long end. The pivot portion 212 is connected to the short end, and the pressing portion 216 is connected to the long end. The pivot portion 212 and the pressing portion 216 are parallel with each other, and the transition portion 214 is oblique to the pivot portion 212 and the pressing portion 216. The pressing portion 216 is located above the pivot portion 212. The pivot portion 212 is used to engage with the extending portion 153 of the second fin 15. The pivot portion 212 defines a through hole 2121 therein to receive the connecting portion 23.

The pressing portion 216 can press the fan 30 by a bottom surface thereof and a protruded portion 2162 formed on the bottom surface thereof. In the present embodiment, the protruded portion 2162 extends downwardly from a central portion of the bottom surface of the pressing portion 216 to press the fan 20.

Each of the connecting portion 23 comprises a shaft 232 and a head 234 located at a top end of the shaft 232. A bore diameter of the through hole 2121 of the pivot portion 212 of the engaging portion 21 is larger than a diameter of the shaft 232 and is smaller than a diameter of the head 234.

The fan 30 comprises a cubical bracket 31 and a blade assembly 33 received in the bracket 31. Central portions of four corners of the bracket 31 are recessed; thus, four triangular mounting portions 312 are formed at bottom end of the bracket 31. Each of the mounting portions 312 defines a mounting hole 314 therein. When the fan 30 is inserted in the recess 14 of the heat sink 10 and the connecting member 20 is mounted on the heat sink 10, a distance between a top surface of the mounting portion 312 and a top surface of the base 11 is larger than that of the bottom surface of the pressing portion 216 and the top surface of the base 11. The pressing portion 216 of the engaging portion 21 is used to abut against the mounting portion 312. The protruded portion 2162 of the pressing portion 216 is used to engage in the mounting hole 314.

Figure 4:
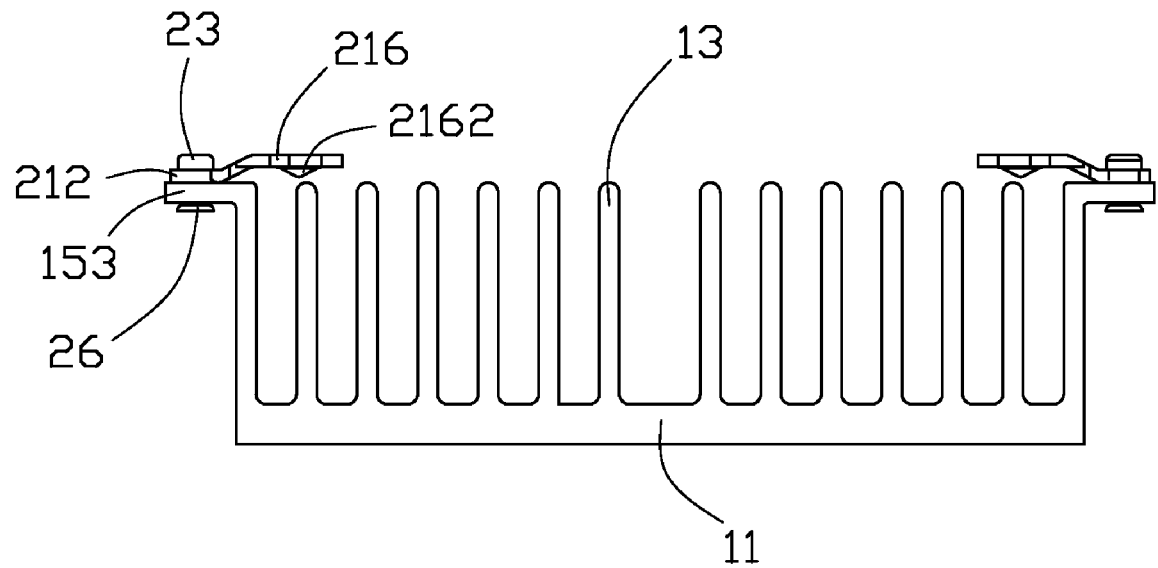
FIG. 4 is an elevation side view of a heat sink and connecting members of the heat dissipation device in FIG. 2.
Figure 5:
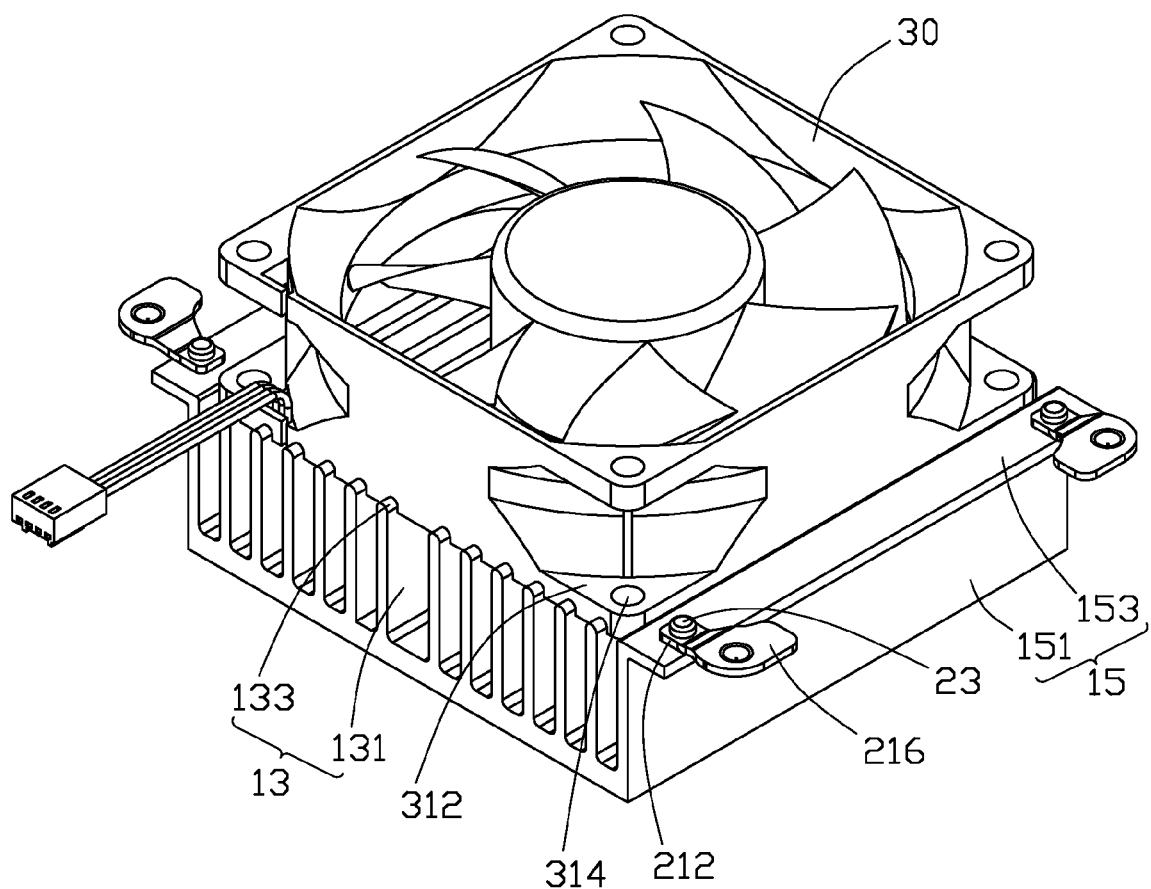
FIG. 5 is a partially assembled view of the heat dissipation device in FIG. 1.

Referring to FIGS. 4-5, in assembly, the connecting members 20 and the heat sink 10 are assembled together firstly. In this process, the pivot portion 212 of the engaging portion 21 is located at an end of one of the two extending portions 153 of the second fins 15, with the through hole 2121 in alignment with a connecting hole 154 (see FIG. 2) of the extending portion 153. The shaft 232 of the connecting portion 23 extends through the through hole 2121 of the pivot portion 212 and the connecting hole 154 of the extending portion 153 to assemble the engaging portion 21 to the heat sink 10. A bottom end of the shaft 232 of the connecting portion 23 is stamped to form a step 236 to abut against a bottom surface of the extending portion 153. Thus, the engaging portion 21 is securely mounted on the heat sink 10. The engaging portion 21 is rotatable relative to the shaft 232 of the connecting portion 23.

A bottom end of the fan 20 is received in the recess 14 of the heat sink 10 and abuts against the tops of the first bodies 131 of the first fins 13, the inner surfaces of the baffling portions 133 of the first fins 13 and the second bodies 151 of the second fins 15. The top surfaces of the mounting portions 312 are located at above of the top surfaces of the two extending portions 153 of the second fins 15. The distance between the top surface of the mounting portion 312 and the top surface of the base 11 is larger than that of the bottom surface of the pressing portion 216 and the top surface of the base 11. The engaging portions 21, one by one, are subject to an external force, which pulls the engaging portions 21 upwardly and then rotate the engaging portions 21 relative to the shaft 232 until the pressing portions 216 are located above the mounting portions 312 and the protruded portions 2162 of the pressing portions 216 align with the mounting holes 314 respectively. Thereafter, the external force is released, whereby, due to the resilience of the connecting members 20, the pressing portions 216 move downwardly to press the mounting portions 312 and the protruded portions 2162 are received in the mounting holes 314. Thus, the heat sink 10 and the fan 30 are assembled together.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink comprising a base and a plurality of first fins and a second fin extending upwardly from a top surface of the base, the second fin comprising a second body connecting the base and an extending portion extending outwardly from a top end of the second body;
   a fan mounted on the first fins of the heat sink, the fan comprising a bracket having a mounting portion;
   an engaging portion comprising a pivot portion pivotally mounted on a top surface of the extending portion of the second fin and a pressing portion extending from the pivot portion and engaging the mounting portion of the fan; and
   a connecting portion comprising a shaft, a head and a step formed on opposite ends of the shaft, the shaft extending through the pivot portion of the engaging portion and the extending portion of the second fin, the head and the step abutting against the pivot portion and the extending portion, respectively;
   wherein the pivot portion is rotatable around the shaft of the connecting portion in a surface parallel to the top surface of the extending portion to make the pressing portion move towards the mounting portion and elastically press the mounting portion.

2. The heat dissipation device as claimed in claim 1, wherein the mounting portion of the bracket of the fan is a plate defining a mounting hole, and a protruded portion extends downwardly from a bottom surface of the pressing portion of the engaging portion and engages in the mounting hole of the mounting portion of the bracket of the fan.

3. The heat dissipation device as claimed in claim 1, wherein the engaging portion further comprises a transition portion connecting the pivot portion and the pressing portion, and the pivot portion and the pressing portion are located at opposite ends of the transition portion and spaced from each other.

4. The heat dissipation device as claimed in claim 3, wherein the pressing portion is located above the pivot portion.

5. The heat dissipation device as claimed in claim 1, wherein the first fins extend upwardly from a central portion of the base, the fan is mounted on a top of the first fins.

6. The heat dissipation device as claimed in claim 1, wherein each of the first fins comprises a first body and two baffling portions extending upwardly from opposite ends of the first body, the fan sandwiched between the baffling portions and supported by tops of the first bodies of the first fins.

7. The heat dissipation device as claimed in claim 6, wherein the heat sink further comprises another second fin, the two second fins are located at opposite sides of the fan, the fan further comprises another mounting portion, top surfaces of the two extending portions of the two second fins and tops of the baffling portions are coplanar, opposite ends of the fan abutting against inner surfaces of the extending portions.

8. A heat dissipation device comprising:
   a heat sink comprising a base and a plurality of first fins and a second fin extending upwardly from a top surface of the base, the second fin comprising a second body connecting the base and an extending portion extending outwardly from a top end of the second body;
   a fan mounted on the first fins of the heat sink, the fan comprising a bracket, a mounting plate formed on the bracket, the mounting plate defining a mounting hole therein;
   an engaging portion comprising a pivot portion pivotally connected to the extending portion of the second fin and a pressing portion extending from the pivot portion, a protruded portion extending downwardly from a bottom surface of the pressing portion, the pivot portion being rotatable relative to the extending portion along an axis parallel to a rotation axis of the fan in a surface perpendicular to the rotational axis of the fan to make the pressing portion press the mounting portion of the bracket of the fan and the protruded portion engage in the mounting hole of the mounting portion.

9. The heat dissipation device as claimed in claim 8, wherein a transition portion connecting with the pressing portion and the pivot portion, the pressing portion and the pivot portion are located at opposite parallel edges of the transition portion.

10. The heat dissipation device as claimed in claim 8, wherein the heat sink further comprises another second fin, the two second fins sandwiching the first fins therebetween, a recess being defined at a top of the heat sink, and the fan received in the recess and abutting against the first and second fins.

11. The heat dissipation device as claimed in claim 10, wherein each of the first fins comprises a first body and two baffling portions extending upwardly from opposite ends of the first body, and the recess is defined by the second bodies of the second fins and the baffling portions of the first fins.

* * * * *